(12) United States Patent
Val

(10) Patent No.: US 10,332,863 B2
(45) Date of Patent: Jun. 25, 2019

(54) METHOD OF MINIATURIZED CHIP ON CHIP INTERCONNECTION OF A 3D ELECTRONIC MODULE

(71) Applicant: 3D PLUS, Buc (FR)

(72) Inventor: Christian Val, St Remy les Chevreuse (FR)

(73) Assignee: 3D PLUS, Buc (FR)

( * ) Notice: Subject to any disclaimer, the term of this patent is extended or adjusted under 35 U.S.C. 154(b) by 0 days.

(21) Appl. No.: 16/077,968

(22) PCT Filed: Feb. 14, 2017

(86) PCT No.: PCT/EP2017/053256
§ 371 (c)(1),
(2) Date: Aug. 14, 2018

(87) PCT Pub. No.: WO2017/140661
PCT Pub. Date: Aug. 24, 2017

(65) Prior Publication Data
US 2019/0103380 A1   Apr. 4, 2019

(30) Foreign Application Priority Data

Feb. 19, 2016 (FR) .................................. 16 51390

(51) Int. Cl.
*H01L 25/065* (2006.01)
*H01L 23/66* (2006.01)
(Continued)

(52) U.S. Cl.
CPC .......... *H01L 25/0657* (2013.01); *H01L 23/16* (2013.01); *H01L 23/5384* (2013.01);
(Continued)

(58) Field of Classification Search
CPC ..... H01L 23/16; H01L 23/66; H01L 23/5384; H01L 23/5386; H01L 25/0657;
(Continued)

(56) References Cited

U.S. PATENT DOCUMENTS 7,517,733 B2 * 4/2009 Camacho ............ H01L 23/3121
438/123
2007/0035007 A1 2/2007 Dietz et al.
(Continued)

FOREIGN PATENT DOCUMENTS

EP    0 638 933 A1   2/1995
EP    2 053 646 A1   4/2009
(Continued)

*Primary Examiner* — Peniel M Gumedzoe
(74) *Attorney, Agent, or Firm* — Baker & Hostetler LLP

(57) ABSTRACT

The invention relates to a 3D electronic module including, in a direction referred to as the vertical direction, a stack (4) of electronic dice (16), each die including at least one chip (1) provided with interconnect pads (10), this stack being attached to an interconnect circuit (2) for the module provided with connection bumps, the pads (10) of each chip being connected by electrical bonding wires (15) to vertical buses (41) that are themselves electrically linked to the interconnect circuit (2) for the module, a bonding wire and the vertical bus to which it is linked forming an electrical conductor between a pad of a chip and the interconnect circuit, characterized in that each electrical bonding wire (15) is linked to its vertical bus (41) by forming, in a vertical plane, an oblique angle ($\alpha 2$) and in that the length of the bonding wire between a pad of a chip of one die and the corresponding vertical bus is different than the length of the bonding wire between one and the same pad of a chip of another die and the corresponding vertical bus, and this is obtained by wiring the bonding wire in a non-rectilinear manner to compensate for the difference in vertical length of the vertical bus from one die to the other, such that the
(Continued)

electrical conductor between the pad of a chip of one die and the interconnect circuit, and the electrical conductor between said same pad of a chip of the other die and the interconnect circuit, are the same length.

12 Claims, 4 Drawing Sheets

(51) Int. Cl.
    *H01L 23/16* (2006.01)
    *H01L 23/538* (2006.01)
    *H01L 25/00* (2006.01)

(52) U.S. Cl.
    CPC .......... *H01L 23/5386* (2013.01); *H01L 23/66* (2013.01); *H01L 25/50* (2013.01); *H01L 2224/32145* (2013.01); *H01L 2225/06548* (2013.01)

(58) Field of Classification Search
    CPC ........... H01L 25/50; H01L 2224/32145; H01L 2225/06548
    See application file for complete search history.

(56) References Cited

U.S. PATENT DOCUMENTS

| | | | | |
|---|---|---|---|---|
| 2009/0108425 | A1* | 4/2009 | Lee | H01L 23/3128 |
| | | | | 257/679 |
| 2009/0267207 | A1* | 10/2009 | Koide | H01L 21/561 |
| | | | | 257/686 |
| 2010/0233852 | A1* | 9/2010 | Do | H01L 21/6835 |
| | | | | 438/109 |

FOREIGN PATENT DOCUMENTS

| | | |
|---|---|---|
| FR | 2 857 157 A1 | 1/2005 |
| FR | 2 895 568 A1 | 6/2007 |
| FR | 2 905 198 A1 | 2/2008 |
| FR | 2 923 081 A1 | 5/2009 |
| WO | 2014/063287 A1 | 5/2014 |

* cited by examiner

METHOD OF MINIATURIZED CHIP ON CHIP INTERCONNECTION OF A 3D ELECTRONIC MODULE

CROSS-REFERENCE TO RELATED APPLICATIONS

This application is a National Stage of International patent application PCT/EP2017/053256, filed on Feb. 14, 2017, which claims priority to foreign French patent application No. FR 1651390, filed on Feb. 19, 2016, the disclosures of which are incorporated by reference in their entirety.

FIELD OF THE INVENTION

The field of the invention is that of 3D electronic modules and, more specifically, that of the interconnection of stacked chips.

BACKGROUND

One solution for interconnecting chips that are stacked on top of one another consists in using the vertical faces of the stack, which are metallized, to form the electrical connections between chips. These chips include connection pads that are connected to connection bumps, but do not include electrical bonding wires leading from these pads. Such a solution, which is also referred to as WDoD technology, is described in the patents FR 2 857 157 (inventors: Val Christian and Lignier Olivier) and FR 2 905 198 (inventor: Val Christian). However, it is expensive to implement.

One less expensive solution consists in using chip-on-chip (CoC) technology, using stacked and wired chips. One example of a 3D electronic module obtained using this technology is shown in FIG. 1 with two chips 1 stacked on an interconnect substrate 2 such as a PCB (printed circuit board). It can be seen that regularly wired wire ribbons 15 link the pads 10 of each chip 1 to the solder bumps 30 of the substrate 2 to which the first chip is bonded, the second chip being bonded to the first.

Stacking chips using chip-on-chip (CoC) technology is to this day one of the densest and most commonly used techniques in the world (e.g. in phones, etc.). The stacked chips 1 include connection pads 10 and electrical bonding wires 15 leading from these pads.

However, the "footprint" or horizontal area (i.e. area in a plane x,y that is perpendicular to the direction z of the stack) taken up by a stack obtained using this CoC technology is generally twice as large as that obtained using WDoD technology. Chips of variable size, having horizontal areas that are typically comprised between 6×6 mm² for small chips and 9×9 mm² for large chips, are generally stacked on an interconnect circuit 2 for interconnecting the stack with another, external circuit by means of connection bumps. In the case of a stack of chips having variable areas, they are stacked in order of decreasing area (the largest chip is at the bottom of the stack on the PCB, and the smallest chip is at the top of the stack).

The solder bumps 30 on the carrier substrate take up a substantial amount of space. It is estimated that, at these solder bumps, the distance between each wire ribbon varies from 400 µm to 800 µm, i.e. 500 µm on average. For four stacked chips, a distance of 4×500 µm=2000 µm=2 mm around the stack is obtained, i.e. for the stack provided with these electrical bonding wires, a horizontal area of:

(6 mm+(2×2 mm))×(6 mm+(2×2 mm))=100 mm² for a stack of four small chips, while, using WDoD, there is 100 µm around the chips, which gives an area of 6.2×6.2=38.5 mm², namely 2.5 times smaller than the area using CoC technology and (9 mm+(2×2 mm))×(9 mm+(2×2 mm))=169 mm² for a stack of four chips with at least one large chip, while WDoD gives an area of 9.2×9.2=84.6 mm², namely 2 times smaller than the area using CoC technology.

Furthermore, the length of the bonding wires varies from 1 to 3 mm between the ribbon that is closest to the chip and the ribbon that is furthest away therefrom.

The {stack with PCB—wires bonded to the substrate} assembly is next overmolded with resin, then diced to obtain a 3D electronic module ready to be delivered to a manufacturer.

Additionally, a problem of signal integrity occurs when the stack includes chips operating in the microwave frequency domain, in particular beyond 2 GHz.

Consequently, there still remains a need for a process for interconnecting stacked chips that simultaneously meets all of the aforementioned needs in terms of fabrication cost, "footprint" and signal integrity at microwave frequencies.

SUMMARY OF THE INVENTION

More specifically, one subject of the invention is a 3D electronic module including, in a direction referred to as the vertical direction, a stack of electronic dice, each die including at least one chip provided with interconnect pads. This stack is attached to an interconnect circuit for the module, provided with connection bumps. The pads of each chip are connected by electrical bonding wires to vertical buses that are themselves electrically linked to the interconnect circuit for the module, a bonding wire and the vertical bus to which it is linked forming an electrical conductor between a pad of a chip and the interconnect circuit. It is mainly characterized in that each electrical bonding wire is linked to its vertical bus by forming, in a vertical plane, an oblique angle and in that the length of the bonding wire between a pad of a chip of one die and the corresponding vertical bus is different than the length of the bonding wire between one and the same pad of a chip of another die and the corresponding vertical bus, and this is obtained by wiring the bonding wire in a non-rectilinear manner to compensate for the difference in vertical length of the vertical bus from one die to the other, such that the electrical conductor between the pad of a chip of one die and the interconnect circuit, and the electrical conductor between said same pad of a chip of the other die and the interconnect circuit, are the same length.

According to one embodiment, the interconnect circuit includes oblique bonding wires and the vertical buses are in a plane located outside the interconnect circuit.

According to another embodiment, the interconnect circuit does not include any bonding wires and the vertical buses pass through the interconnect circuit.

The chips may be capable of running at over 1 GHz.

The thickness of the vertical buses, which are typically obtained by metallization and etching, is generally less than 10 µm.

According to one alternative, the vertical buses take the form of metallized vias.

An electronic circuit with passive components and including bonding wires may be inserted into the stack.

Another subject of the invention is a process for fabricating a 3D electronic module such as described above, characterized in that it includes the following steps carried out collectively:

A) stacking an electronic die on top of the interconnect circuit, and connecting pads of the chip (or chips) to a metallized substrate that is located at the same level as the interconnect circuit by means of bonding wires so as to obtain bonding wires that are inclined in a vertical plane, iterating this step with a new electronic die stacked on top of the preceding stack until a predefined stack is obtained;

B) depositing an epoxy resin to overmold the stack and its bonding wires, and the interconnect circuit;

C) vertically cutting through the resin along vertical planes that are located outside the stack to obtain a plurality of packages;

and in that it includes the following step carried out individually for each package: metallizing and etching the vertical faces of the package so as to form the vertical buses and to obtain a 3D electronic module.

According to one alternative, the process for fabricating a 3D electronic module includes the following steps carried out collectively:

A) stacking an electronic die on top of the interconnect circuit, and connecting pads of the chip (or chips) to a metallized substrate that is located at the same level as the interconnect circuit by means of bonding wires so as to obtain bonding wires that are inclined in a vertical plane, iterating this step with a new electronic die stacked on top of the preceding stack until a predefined stack is obtained;

B) depositing an epoxy resin to overmold the stack and its bonding wires, and the interconnect circuit;

C) drilling vias through the resin outside the stack, and metallizing the vias to form the vertical buses;

C) vertically cutting through the resin along vertical planes beyond the vias to obtain a plurality of packages.

The interconnect circuit does not have to include any bonding wires; the cutting operation is then performed through a vertical plane passing through the PCB.

The interconnect circuit may include bonding wires that are linked to the metallized substrate; the cutting operation is then performed through a vertical plane located between the interconnect circuit and the metallized substrate and the bonding wires form, in the vertical cutting plane, an oblique angle.

BRIEF DESCRIPTION OF THE DRAWINGS

Other features and advantages of the invention will become apparent on reading the detailed description that follows, given by way of non-limiting example and with reference to the appended drawings, in which.

From one figure to another, the same elements bear the same references.

DETAILED DESCRIPTION

In the rest of the description, the expressions "high" and "low" are used with reference to the orientation of the described figures. Insofar as the 3D electronic module may be positioned according to other orientations, the directional terminology is indicated by way of illustration and is not limiting.

The solution according to the invention is based on an ingenious combination of CoC and WDoD technologies. The chips are stacked on an interconnect circuit board using CoC technology and the overall assembly is overmolded in resin. Next, using WDoD technology, this assembly is vertically diced and the bonding wires that show on the surface of the cut faces are then connected to vertical metal buses for the purpose of vertically interconnecting the chips to one another and with the interconnect circuit.

The applicant has identified the cause of the problem of a 3D electronic module with vertical connections on the faces of the stack operating in the microwave frequency domain. Specifically, when making T-connections between electrical conductors (conductors 15 leading from the chips 1 and vertical conductors 41) that are positioned at right angles ($\alpha 1=90°$) as shown in FIG. 2a, electrons are reflected at the site of the connection, which interferes with the electrical connection and weakens it.

Figure 1:
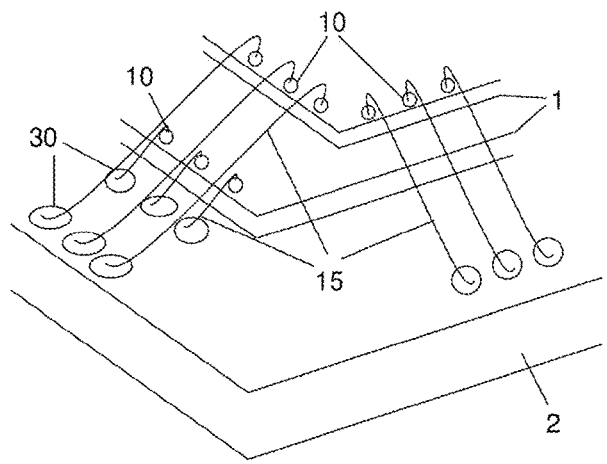
FIG. 1, described above, schematically shows, in section, an example of a 3D electronic module obtained using CoC technology according to the prior art.
Figures 2A, 2B:
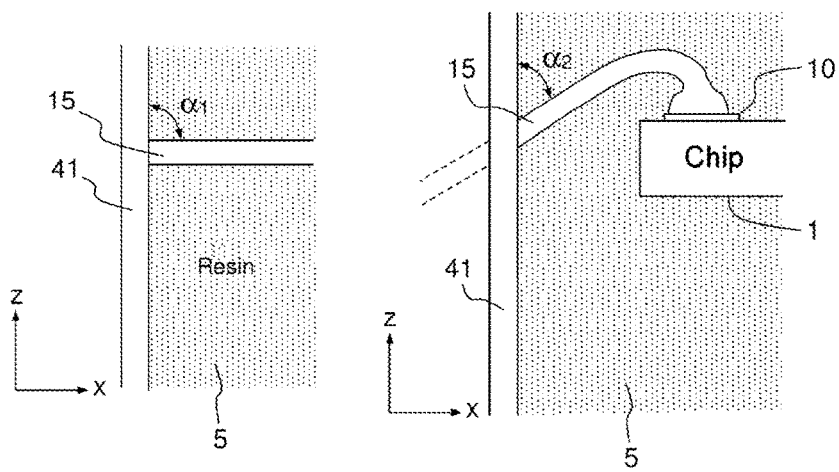
FIGS. 2a and 2b schematically show, in section, electrical connections at right angles (FIG. 2a) and at oblique (non-right) angles (FIG. 2b)

The solution according to the invention for avoiding these electron reflections is to make, at the site of the connections with the vertical buses 41, oblique connections, i.e. connections at oblique or non-right angles ($\alpha 2<90°$ or $\alpha 2>90°$) as shown in FIG. 2b, while keeping the horizontal area of the stack to a minimum.

The steps of the process for fabricating such a 3D electronic module will now be described in detail.

Figure 3:
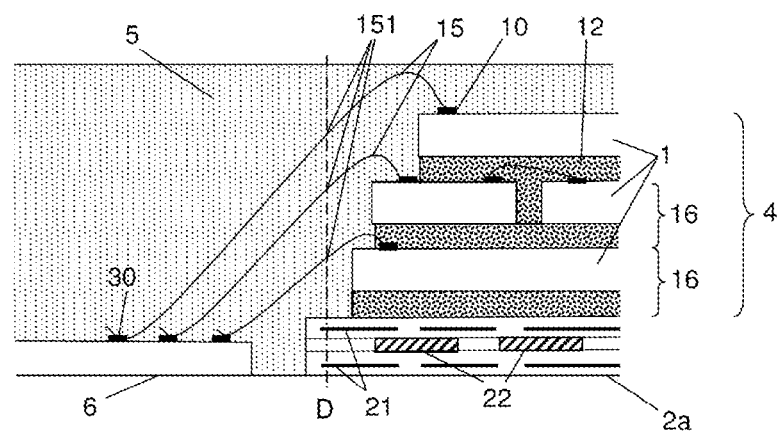
FIG. 3 schematically shows, in section, an example of a 3D electronic module with a standard PCB being fabricated via the process according to the invention.

The substrate for the stack is fabricated. The substrate is a, generally multilayer, interconnect circuit 2, which may be a PCB including copper conducting wires or an alumina substrate including tungsten, nickel or gold conducting wires. Throughout the rest of the description, a PCB will be used, by way of example, as the interconnect circuit. This PCB may have a plurality of configurations:

Standard PCB 2a, i.e. a PCB without bonding wires, having a horizontal area that is larger than that of the stack 4 so that it is itself diced when dicing the assembly overmolded in the resin 5 along a plane D as shown in FIG. 3: the vertical interconnection between the PCB 2a and the sections 151 of bonding wires 15 leading from the chips 1 and showing on the surface of the cut faces of the stack is made by forming vertical buses 41 that are connected to the cut sections 151 and meet with the metal conductors 21 included in the PCB For certain applications, including space applications, it is preferable not to dice the PCB. In that case, a PCB 2b with bonding wires 25 leading from connection pads 20 that are arranged on its perimeter, so as to be consistent with the other wires 15 of the stack 4, is used. Vertical interconnections are then made between all of the sections 151, 251 of wires without going through the conductors 21 of the PCB.

Figure 4:
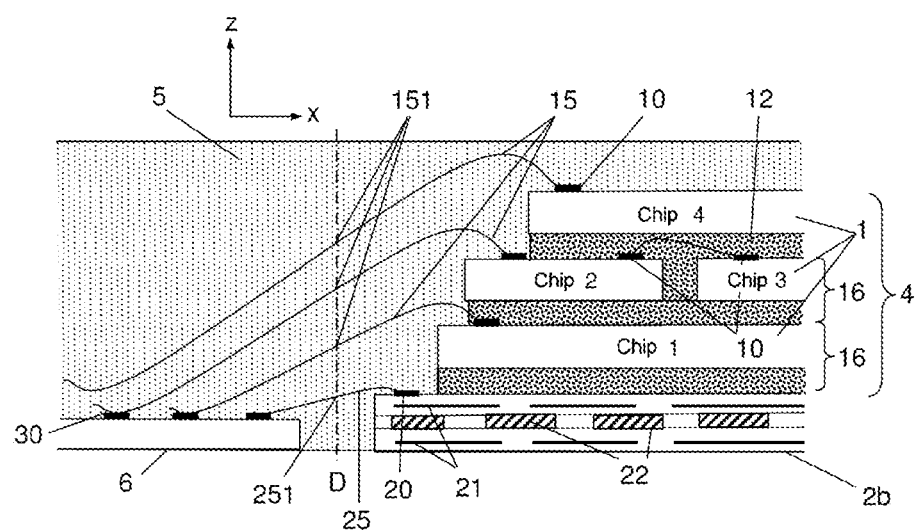
FIG. 4 schematically shows, in section, an example of a 3D electronic module with a PCB with bonding wires being fabricated via the process according to the invention.

In both cases, the interconnect circuit 2 may itself include components 22 (generally passive components), which:

are embedded in the PCB, which is the current trend according to an embedded die process, as shown in FIGS. 3 and 4;

are attached by reflow soldering and/or wire-bonding on the reverse side (=bottom) of the PCB or of the alumina substrate and then overmolded so as to have a flat surface, the top side being used for the wire-bonding of the chip-on-chip chips.

Of course, when a PCB or an alumina substrate with components is used in the standard way, without bonding wires, the dicing operation along D through the PCB or the alumina substrate is performed outside of the components, as can be seen in FIG. 3.

A stack 4 is then formed on this PCB according to the first steps of the chip-on-chip fabrication process. A first chip is bonded to the PCB then wired using the wires 15, a second chip is bonded to the first chip then wired, a third chip is bonded to the preceding level then wired, etc. Each level of the stack may include one or more chips 1: these are then referred to as electronic dice 16 including at least one chip 1. The following steps described with reference to FIGS. 3 and 4 are carried out collectively:

A) stacking a die 16 on top of the interconnect circuit 2 by means of an adhesive 12, such as an epoxy adhesive for example, and connecting the pads 10 of the chip (or chips) of the die 16 to a metallized substrate 6 positioned on the PCB 2, via electrical bonding wires 15, so as to obtain oblique bonding wires, i.e. wires that are inclined in a vertical plane z as shown in FIG. 2b; iterating this step by stacking a new die on top of the lower die until obtaining a predefined stack of dice, of at least two dice, and typically including four to nine dice. The carrier substrate 6 could form part of the PCB 2 but it is less expensive to use a simpler carrier that does not require a plurality of interconnect levels like the PCB since its function is only to bear the solder bumps 30 for the various wires 15. A metal carrier 6, such as a sheet of nickel- or gold-metallized copper, is sufficient.

B) depositing an epoxy resin 5 to overmold the stack 4 with the oblique bonding wires 15 (and optionally 25), and the PCB 2;

C) cutting through the resin 5 along four vertical cutting planes that are located outside the stack to obtain a plurality of packages. Sections of the set of wires 15 appear on one, two, three or four faces of the module, the bonding wires forming an oblique angle in the corresponding cutting planes.

When using a standard PCB 2a, one (or more) vertical cutting plane(s) D pass through the PCB, as shown in FIG. 3, while typically being located approximately 0.2 mm from the edge of the chip 1 having the largest horizontal area.

When using a PCB 2b with bonding wires as shown in FIG. 4, the fabrication process includes a prior step (before step A)) of connecting the pads 20 of the PCB 2b to the metallized substrate 6 using bonding wires 25, so as to obtain oblique bonding wires, as in step A). A vertical cutting plane of step C) is located between the PCB 2b (having a horizontal area that is larger than those of the dice stacked on top) and the metallized substrate 6.

D) this step D is carried out individually for each package: the four vertical faces of the package are metallized then etched to form the metal connection buses 41 linking the sections 151 of bonding wires 15, and optionally the sections 251, to the PCB 2, thus obtaining a 3D electronic module. These vertical buses 41 are almost planar: they are less than 10 μm thick (in a direction perpendicular to z).

Figure 5A:
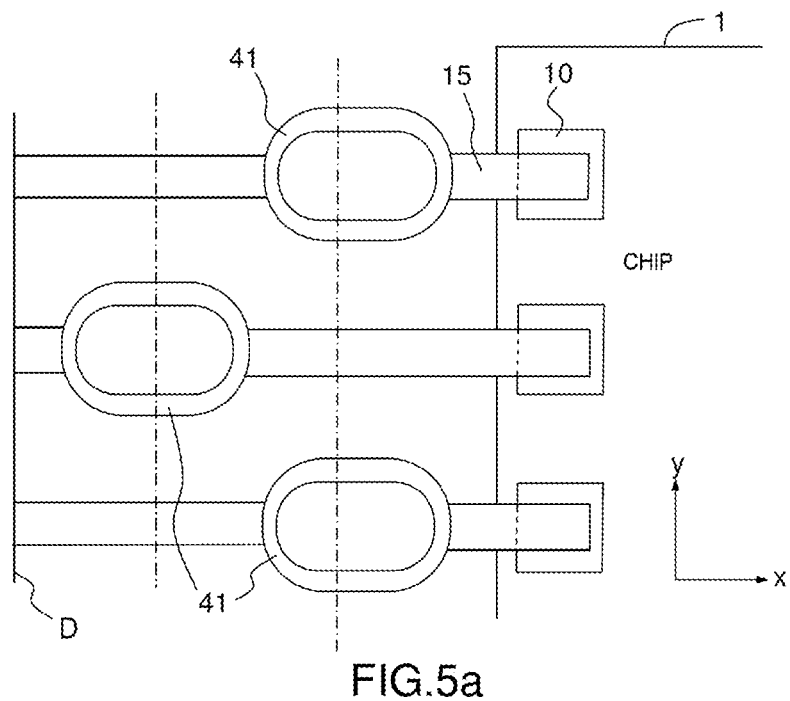
FIGS. 5a and 5b schematically show one embodiment of vertical buses in the form of vias seen from above (FIG. 5a) and in section (FIG. 5b), FIG. 6 schematically shows, in perspective, an example of a 3D electronic module according to the invention with non-rectilinear bonding wires, etched vertical buses and a PCB without bonding wires.
Figure 5B:
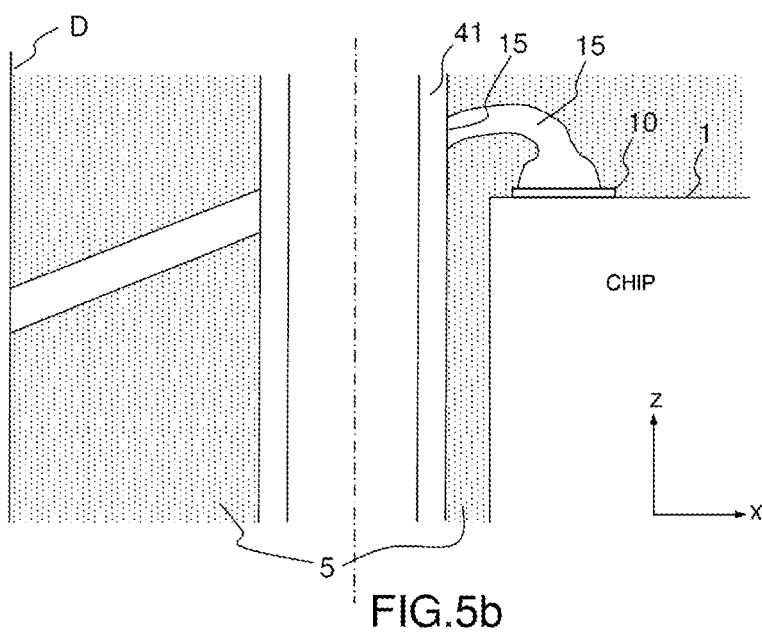

According to one alternative, steps C and D are replaced by the following collective steps:

C') drilling vertical vias through the resin 5 deposited in step B and outside of the stack 4, the bonding wires 15 forming an oblique angle with these vias as shown in FIG. 5b, and metallizing the vias to form the vertical buses 41 for connecting the sections of bonding wires to the PCB. They are optionally positioned in parallel planes as shown in FIG. 5a. This technique is described in the patents no. 2 895 568 and no. 2 923 081 (inventor: Christian Val). Depending on the PCB used, the vias are drilled through the PCB for a standard PCB without bonding wires or between the PCB and the metallized substrate for a PCB with bonding wires.

D') vertically dicing the assembly beyond the vias, along D, to obtain a plurality of 3D electronic modules.

A 3D electronic module that is interconnected by the vertical faces of the stack is thus obtained, the bonding wires leading from the chips forming a non-right angle ($\alpha 2$) with the vertical plane of the interconnections. Electron reflections are thus avoided, in particular at high frequencies (beyond 1 GHz).

To ensure the integrity of the signals from one chip to another, in particular for high-frequency (>1 GHz) signals, it is necessary to have the same (or the closest possible) impedance between the signals; stated otherwise, it is necessary to have electrical conductors of the same length since the parasitic capacitances and inductances are the same in conductors of the same length.

Figure 6:
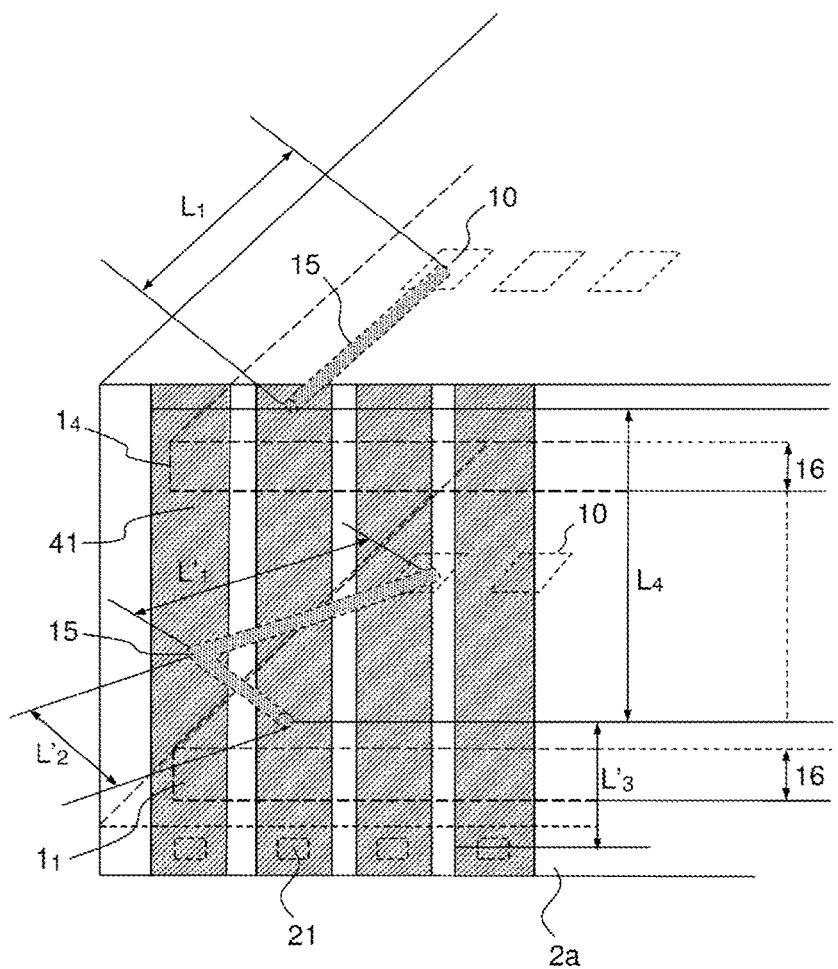

The length of an electrical conductor 15 between the pad 10 of the chip $1_4$ (shown in FIG. 6) of the die 16 located at the top of the stack 4 and the PCB 2a or 2b, via the vertical bus 41, is a priori much greater than the length of the electrical conductor 15 between the pad 10 of the chip 1, of the die 16 located at the bottom of the stack 4 and the PCB 2a or 2b, via the same vertical bus 41. This electrical connection length varies from one chip to another depending on its position (in terms of height) in the stack and potentially on its position in terms of xy in the plane of the die when there are multiple chips per die. According to the invention, these differences in length are compensated for by increasing the length of the bonding wire between the pad of the chip and the connection with the vertical bus, i.e. before its connection to the vertical bus, by means of non-rectilinear wiring. Stated otherwise, the length of the electrical conductor is adjusted so as to compensate for its vertical length such that all of the conductors have the same overall length (from the pad to the interconnect circuit). More specifically, since the vertical conductors 41 are straight regardless of whether they are etched or in the form of metallized vias, it is therefore necessary to adjust the preceding lengths, i.e. those of the bonding wires. A conductor is therefore not always routed in a straight line between the pad 10 of the chip and the corresponding vertical bus 41 for this reason. Thus, as can be seen in FIG. 6:

the electrical conductor corresponding to the chip of the first die 16 (at the bottom, chip $1_1$) measures: L1'+L2'+L3', where L1'+L2' is the length of the non-rectilinear wire 15 leading from the pad $10_1$ of the chip until meeting with the metal bus 41, and L3' is the distance along the bus 41 between this meeting and a conductor 21 of the PCB 2a;

the conductor corresponding to the chip of the last die 16 (at the top, chip $1_4$; the intermediate dice are not shown) measures: L1+L4+L3', where L1 is the length of the rectilinear wire 15 leading from the pad $10_4$ of the chip until meeting with the same metal bus 41, and L4+L3' is the distance along the bus 41 between this meeting and the conductor 21 of the PCB 2a.

Since L4 is dictated by the level of the die in the stack, and L1 is generally determined by rectilinear wiring between the pad and the meeting with the vertical bus, compensating for the differences in the lengths of the conductors therefore comes down to choosing L1' and L2' so as to give:

$$L1'+L2'=L1+L4.$$

In the figure and so as not to overload it, only one conductor per die is shown. Of course, compensating for length in this manner applies to all of the conductors concerned. For one and the same die, the non-rectilinear wire bonds may be made using metal bonding wires that do not cross (do not touch), or else using insulated bonding wires, which may then cross.

This type of non-rectilinear wire bond may be made industrially using new equipment for wire-bonding chips, which equipment has been developed to facilitate the routing of wires for chip-on-chip techniques (which wires may cross); the fabrication process according to the invention does not use this device to avoid crossing but instead to ensure constant impedance.

From one die to another in the stack, the chips 1 may be, but do not have to be, identical. In the case of different chips, it is generally necessary to differentiate, from one die from another, the wiring (the path) of the bonding wires between the pads 10 of one chip and their connection 151 to the vertical buses. In the case of identical chips, the bonding wires leading from one and the same pad are generally short-circuited for chips that are identical from one die to another by the corresponding vertical bus (which is the same vertical bus). However, it may be necessary for a signal associated with the pad of one chip to be independent of the signal associated with the same pad of an identical chip located in another die. In all of these cases in which short-circuiting the bonding wires must be avoided, indirect routing is also carried out to join different vertical buses. However, it is not necessary to compensate for the lengths of the bonding wires, since it is not necessary to obtain identical impedances.

It is possible to insert a PCB including passive components 22 into the stack 4. Specifically, these passive components cannot be wire-bonded using wires 15 since their bonding pads are intended only for attachment by reflow soldering and it is not possible to wire-bond them. In this case, these components may be attached and soldered conventionally to a PCB that is inserted into the stack 4. This PCB will most likely take the standard form 2a.

The invention claimed is:

1. A 3D electronic module including, in a direction referred to as the vertical direction, a stack of electronic dice, each die including at least one chip provided with interconnect pads, the stack being attached to an interconnect circuit for the module provided with connection bumps, the interconnect pads of each chip being connected by electrical bonding wires to vertical buses that are themselves electrically linked to the interconnect circuit for the module, a bonding wire and the vertical bus to which it is linked forming an electrical conductor between an interconnect pad of a chip and the interconnect circuit, wherein each electrical bonding wire is linked to its vertical bus by forming, in a vertical plane, an oblique angle with its vertical bus and in that a length of the bonding wire between an interconnect pad of a chip of one die and a corresponding vertical bus is different than a length of the bonding wire between one and a same interconnect pad of a chip of another die and the corresponding vertical bus, and this is obtained by wiring the bonding wire in a non-rectilinear manner to compensate for a difference in vertical length of the vertical bus from one die to the other, such that the electrical conductor between the interconnect pad of a chip of one die and the interconnect circuit, and the electrical conductor between said same interconnect pad of a chip of the other die and the interconnect circuit, are the same length.

2. The 3D electronic module as claimed in claim 1, wherein the interconnect circuit includes electrical bonding wires that are linked to vertical buses by forming oblique angles and in that the vertical buses are in a plane located outside the interconnect circuit.

3. The 3D electronic module as claimed in claim 1, wherein the interconnect circuit does not include any bonding wires and in that the vertical buses pass through the interconnect circuit.

4. The 3D electronic module as claimed in claim 1, wherein the chips are capable of running at over 1 GHz.

5. The 3D electronic module as claimed in claim 1, wherein the number of stacked dice is comprised between 4 and 9.

6. The 3D electronic module as claimed in claim 1, wherein a thickness of the vertical buses is less than 10 µm.

7. The 3D electronic module as claimed in claim 1, wherein the vertical buses take the form of metallized vias.

8. The 3D electronic module as claimed in claim 1, wherein an electronic circuit with passive components and including electrical bonding wires is inserted into the stack.

9. A process for fabricating a 3D electronic module as claimed in claim 1, wherein it includes the following steps carried out collectively:
   A) stacking an electronic die on top of the interconnect circuit, and connecting interconnect pads of the chip to a metallized substrate that is located at a same level as the interconnect circuit by means of electrical bonding wires so as to obtain bonding wires that are inclined in a vertical plane, iterating this step with a new electronic die stacked on top of the preceding stack until a predefined stack is obtained;
   B) depositing an epoxy resin to overmold the stack and its bonding wires, and the interconnect circuit;
   C) vertically cutting through the resin along vertical planes that are located outside the stack to obtain a plurality of packages;
   and in that it includes the following step carried out individually for each package: metallizing and etching the vertical faces of the package so as to form the vertical buses and to obtain a 3D electronic module.

10. A process for fabricating a 3D electronic module as claimed in claim 1, wherein it includes the following steps carried out collectively:
   A) stacking an electronic die on top of the interconnect circuit, and connecting interconnect pads of the chip to a metallized substrate that is located at a same level as the interconnect circuit by means of bonding wires so as to obtain bonding wires that are inclined in a vertical plane, iterating this step with a new electronic die stacked on top of the preceding stack until a predefined stack is obtained;
   B) depositing an epoxy resin to overmold the stack and its conductors, and the interconnect circuit;
   C) drilling vias through the resin outside the stack, and metallizing the vias to form the vertical buses;

C) vertically cutting through the resin along vertical cutting planes beyond the vias to obtain a plurality of packages.

11. The process for fabricating a 3D electronic module as claimed in claim 9, wherein the interconnect circuit does not include any electrical bonding wires and in that the cutting operation is performed through at least one vertical cutting plane passing through the interconnect circuit.

12. The process for fabricating a 3D electronic module as claimed in claim 9, wherein the interconnect circuit includes bonding wires that are linked to the metallized substrate before the step of depositing the resin, in that the cutting operation is performed through at least one vertical cutting plane located between the interconnect circuit and the metallized substrate and in that the bonding wires for the interconnect circuit form, in the vertical cutting plane, an oblique angle.

* * * * *